(12) United States Patent
Subrahmaniyan Radhakrishnan (10) Patent No.: US 9,300,333 B2
(45) Date of Patent: Mar. 29, 2016

(54) METHODS FOR COMPUTING PREDISTORTION VALUES FOR WIRELESS SYSTEMS

(71) Applicant: Apple Inc., Cupertino, CA (US)

(72) Inventor: Gurusubrahmaniyan Subrahmaniyan Radhakrishnan, Theagaraya Nagar (IN)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/449,976

(22) Filed: Aug. 1, 2014

(65) Prior Publication Data

US 2016/0036471 A1 Feb. 4, 2016

(51) Int. Cl.
 *H04B 3/46* (2015.01)
 *H04B 1/04* (2006.01)
 *H04W 52/02* (2009.01)

(52) U.S. Cl.
 CPC ......... *H04B 1/0475* (2013.01); *H04W 52/0209* (2013.01)

(58) Field of Classification Search
 CPC ........... H04L 27/10; H03F 3/19; H03F 3/245; H03F 1/3247; H03F 1/3258; H04B 1/0475; H04W 52/0209
 USPC ........................................................ 375/224
 See application file for complete search history.

(56) References Cited

U.S. PATENT DOCUMENTS

| | | | |
|---|---|---|---|
| 6,621,340 B1 * | 9/2003 | Gerhaeuser et al. | 330/149 |
| 6,885,241 B2 | 4/2005 | Huang et al. | |
| 6,957,044 B2 * | 10/2005 | Beech et al. | 455/13.4 |
| 7,035,345 B2 | 4/2006 | Jeckeln et al. | |
| 7,330,073 B2 * | 2/2008 | Persson et al. | 330/149 |
| 8,111,101 B2 * | 2/2012 | Brown et al. | 330/149 |
| 2002/0101937 A1 | 8/2002 | Antonio et al. | |
| 2003/0063686 A1 * | 4/2003 | Giardina et al. | 375/296 |
| 2003/0133404 A1 * | 7/2003 | Castelain et al. | 370/203 |
| 2003/0146787 A1 * | 8/2003 | Hedberg et al. | 330/149 |
| 2005/0111574 A1 * | 5/2005 | Muller | H03F 1/32 375/296 |
| 2005/0201487 A1 * | 9/2005 | Gaschler et al. | 375/296 |
| 2006/0008027 A1 * | 1/2006 | Gao et al. | 375/297 |
| 2006/0178120 A1 * | 8/2006 | Puma | H03F 1/3241 455/114.3 |
| 2008/0107088 A1 * | 5/2008 | Jin et al. | 370/336 |
| 2010/0159855 A1 * | 6/2010 | Hardacker et al. | 455/114.3 |
| 2011/0317786 A1 * | 12/2011 | Mujica et al. | 375/296 |
| 2012/0200355 A1 * | 8/2012 | Braithwaite | H03F 1/3247 330/147 |
| 2014/0210558 A1 * | 7/2014 | Matsumoto et al. | 330/296 |
| 2014/0233621 A1 * | 8/2014 | Krishnan | H04B 17/13 375/224 |
| 2014/0250309 A1 * | 9/2014 | Dietze | 713/300 |
| 2015/0054579 A1 * | 2/2015 | Omer et al. | 330/149 |

* cited by examiner

*Primary Examiner* — Syed Haider
(74) *Attorney, Agent, or Firm* — Treyz Law Group, P.C.; Jason Tsai; Joseph F. Guihan (57) ABSTRACT

Methods for performing predistortion calibration on wireless communications circuitry are provided. The wireless communications circuitry may be adjusted using a digital gain setting and a radio gain index setting. A particular channel in a given band exhibiting the maximum dynamic range may be selected for measurement. Predistortion coefficient values may be computed based on measured results in the select channel. A power list may be obtained for the selected channel based on a maximum peak power level. A reference power list may then be obtained based on the minimum dynamic range in the given band. The predistortion coefficients associated with the selected channel may be translated from its power list to the reference power list. Predistortion coefficients for the remaining channels in the given band may similarly be computed by interpolating/extrapolating based on the values in their respective power lists and the reference power list.

19 Claims, 10 Drawing Sheets

| RGI | Pout, rms |
|---|---|
| 1 | Pout, rms1 |
| 2 | Pout, rms2 |
| 3 | Pout, rms3 |
| ⋮ | ⋮ |
| 31 | Pout, rms31 |

*FIG. 6*

| $G_d$ | Pout, rms |
|---|---|
| $G_1$ | Pout, rms-1 |
| $G_2$ | Pout, rms-2 |
| $G_3$ | Pout, rms-3 |
| $G_4$ | Pout, rms-4 |

| Pout from $PL_{c^{\wedge}}$ | $AMAM_{c^{\wedge}}$ | | Pout from PLref | NV $AMAM_{c^{\wedge}}$ |
|---|---|---|---|---|
| -10 | 240 | | -12 | $= 240 + (-12+10)\left(\frac{340-240}{-5+10}\right)$ |
| -5 | 340 | $\Longrightarrow$ TRANSLATE | -8 | $= 240 + (-8+10)\left(\frac{340-240}{-5+10}\right)$ |
| . | . | | . | . |
| . | . | | . | . |
| . | . | | . | . |
| $DR_{c^{\wedge}}$ | 10400 | | DRmin | |

*FIG. 12*

| Pout from $PL_1$ | $AMAM_{c^{\wedge}}$ | | Pout from PLref | NV $AMAM_1$ |
|---|---|---|---|---|
| a | 240 | | -12 | $= 240 + (-12-a)\left(\frac{340-240}{b-a}\right)$ |
| b | 340 | $\Longrightarrow$ TRANSLATE | -8 | $= 240 + (-8-b)\left(\frac{340-240}{b-a}\right)$ |
| . | . | | . | . |
| . | . | | . | . |
| . | . | | . | . |
| DR1 | 10400 | | DRmin | |

*FIG. 13*

METHODS FOR COMPUTING PREDISTORTION VALUES FOR WIRELESS SYSTEMS

BACKGROUND

This relates generally to electronic devices, and more particularly, to electronic devices with wireless communications capabilities.

Electronic devices with wireless communications capabilities typically include amplifying circuits that are used to amplify the power of radio-frequency signals prior to wireless transmission. For example, a radio-frequency power amplifier may receive input signals having an input power level and generate corresponding output signals having an output power level, where the output power level of the output signal is generally greater than the input power level of the input signal. Ideally, the power amplifier exhibits a perfectly linear input-output power transfer characteristic (i.e., an increase in the input power by a certain amount should result in a corresponding predetermined amount of increase in the output power).

In practice, however, power amplifiers often exhibit non-linear behavior. When a power amplifier is non-linear, an increase in the input power may result in a corresponding increase in the output power that is different than the predetermined amount. Amplifier non-linearity issues can degrade signal integrity and adversely impact wireless performance.

Consumer electronic devices are sometimes configured to support complex, non-constant envelope modulation schemes such as Wideband Code Division Multiple Access (W-CDMA) and Long Term Evolution (LTE) that encode digital data using Orthogonal Frequency-Division Multiplexing (OFDM). High frequency signals generated using such types of radio access technologies can exhibit high peak-to-average ratios (PARs), which places stringent requirements on the linearity of the power amplifier. This increases the power consumption of the power amplifier, which negatively impacts battery life. In order to improve the battery life, it is generally desirable to operate the power amplifiers in the non-linear region.

When radio-frequency power amplifiers are operated in the non-linear region, however, undesired spectral regrowth may be generated that degrades the transmit modulation quality. To reduce this effect, predistortion calibration operations are typically performed to linearize the wireless system. Predistortion calibration involves steps for obtaining amplitude and phase coefficient terms that are used to predistort signals in the modem, which are fed to the transceiver for digital to high frequency RF conversion. This ensures satisfactory transmit quality without compromising on efficiency.

Conventional predistortion calibration, however, requires capturing IQ samples at the output of the power amplifier, correlating the captured output IQ samples to input IQ samples, and then computing the inverse to obtain predistortion coefficients that linearize the system. This step has to be performed at each channel within each band of interest. Performing predistortion calibration for every in-band channel in this way can be extremely time consuming and costly to implement.

It would therefore be desirable to provide improved ways for computing predistortion coefficient values for wireless systems.

SUMMARY

A method for testing wireless communications circuitry on an electronic device is provided. The method may include steps for obtaining predistortion values for a selected channel in a given radio-frequency band by computing an inverse on input-output signals measured from the selected channel and steps for obtaining predistortion values for other channels in the radio-frequency band without performing any additional IQ captures. The predistortion values may serve as predistortion coefficient values that are used to counteract non-linearity issues associated with a radio-frequency power amplifier in the wireless communications circuitry.

The method may also involve identifying a dynamic range for each channel in the radio-frequency band and computing a power list for each channel in the radio-frequency band. Each power list may include a list of discrete power levels computed based on expressions that are a function of the identified dynamic range associated with each respective channel. A reference power list may also be computed based on a minimum dynamic range of the radio-frequency band.

Predistortion values for the selected channel may be computed by translating the predistortion values that are plotted against the power list for the selected channel to normalized predistortion values that are plotted against the reference power list (e.g., by interpolating and/or extrapolating values based on the predistortion values obtained as a result of the inverse calculation, the output power levels in the power list of the selected channel, and the output power levels in the reference power list). Predistortion values for the other channels may be computed by translating the predistortion values that are plotted against the power lists for the other channels to normalized predistortion values that are plotted against the reference power list (e.g., by interpolating and/or extrapolating values based on the predistortion values obtained as a result of the inverse calculation, the output power levels in the power list of other channels, and the output power levels in the reference power list). This ensures that predistortion values for each in-band channel are "normalized" or calibrated to a common reference power list.

Normalized predistortion values for each channel computed in this way may serve as configuration data can then be loaded into non-volatile memory on the electronic device so that the electronic device can exhibit satisfactory linearity during normal wireless operation.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

DETAILED DESCRIPTION

This relates generally to electronic devices, and more particularly, to electronic devices having wireless communications capabilities.

Electronic devices that include wireless communications circuitry may be portable electronic devices such as laptop computers or small portable computers. Portable electronic devices may also be somewhat smaller devices. The wireless electronic devices may be, for example, cellular telephones, media players with wireless communications capabilities, handheld computers (also sometimes called personal digital assistants), remote controllers, global positioning system (GPS) devices, tablet computers, and handheld gaming devices. Wireless electronic devices such as these may perform multiple functions. For example, a cellular telephone may include media player functionality and may have the ability to run games, email applications, web browsing applications, and other software.

Figure 1:
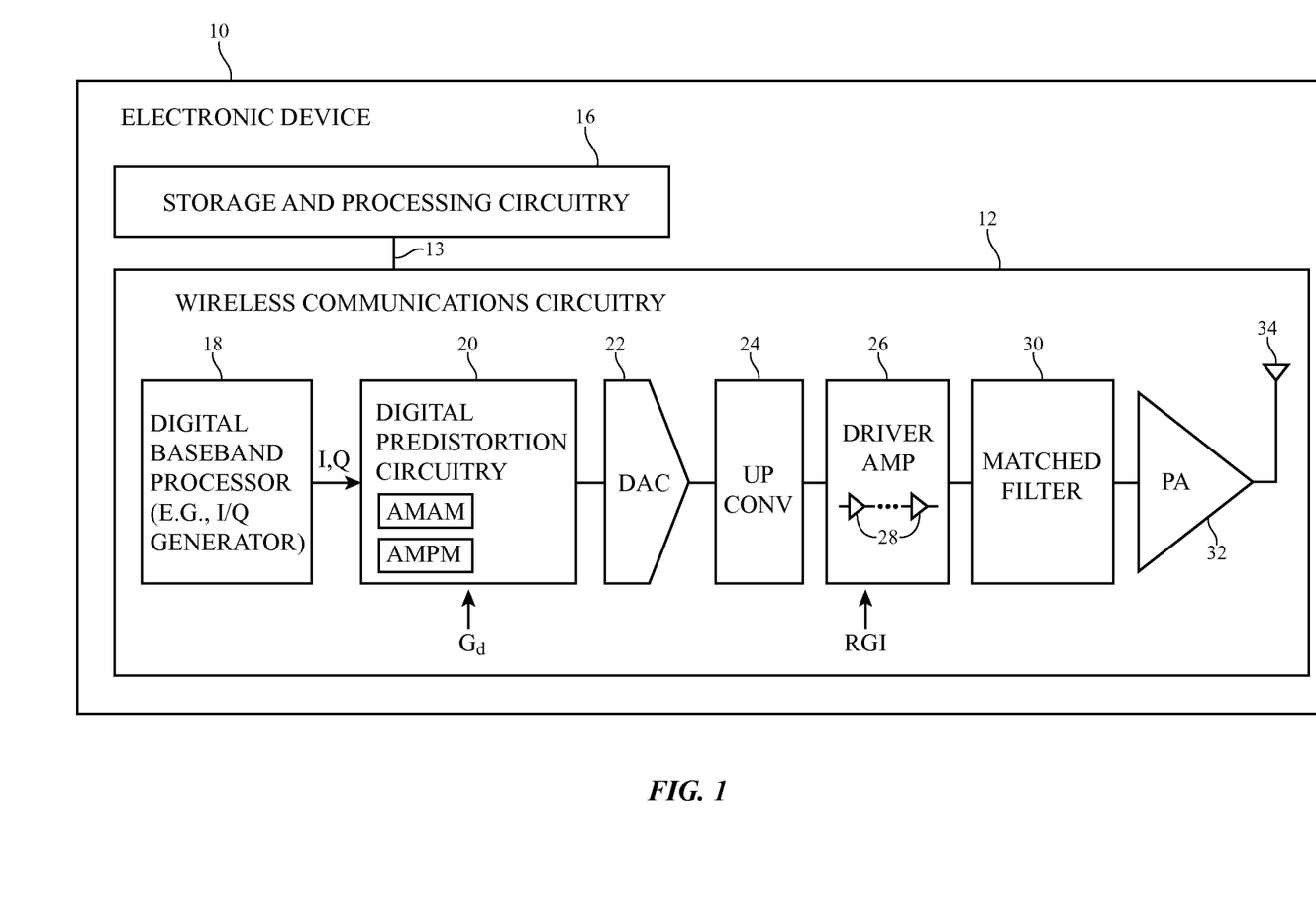
FIG. 1 is a diagram of an illustrative electronic device having wireless communications circuitry in accordance with an embodiment.

FIG. 1 shows an illustrative electronic device 10 that includes wireless communications circuitry such as wireless communications circuitry 12. As shown in FIG. 1, wireless communications circuitry 12 may include at least a baseband processor 18, digital predistortion (DPD) circuitry 20, a digital-to-analog converter (DAC) 22, an up-converter 24, a driver amplifier circuit 26, a matched filter 30, a radio-frequency power amplifier 32, and an antenna 34. The example of FIG. 1 shows only circuitry in the transmit (Tx) path. In general, wireless communications circuitry 12 may also include processing circuitry in the receive (Rx) path such as a low noise amplifier, a down converter, an analog-to-digital converter (ADC), an impedance matching circuit, and other associated control circuitry.

Device 10 may also include storage and processing circuitry such as storage and processing circuitry 16. Storage and processing circuitry 16 may include one or more different types of storage such as hard disk drive storage, nonvolatile memory (e.g., flash memory or other electrically-programmable-read-only memory), volatile memory (e.g., static or dynamic random-access-memory), etc. Storage and processing circuitry 16 may be used in controlling the operation of device 10. Processing circuitry in circuitry 16 may be based on processors such as microprocessors, microcontrollers, digital signal processors, dedicated processing circuits, power management circuits, audio and video chips, radio-frequency transceiver processing circuits, radio-frequency integrated circuits of the type that are sometimes referred to as baseband modules, and other suitable integrated circuits.

Storage and processing circuitry 16 may be used in implementing suitable communications protocols. Communications protocols that may be implemented using storage and processing circuitry 16 include internet protocols, wireless local area network protocols (e.g., IEEE 802.11 protocols—sometimes referred to as Wi-Fi®), protocols for other short-range wireless communications links such as the Bluetooth® protocol, protocols for handling 2G cellular telephone communications protocols such as GSM (Global System for Mobile Communications) and CDMA (Code Division Multiple Access), 3G cellular telephone communications protocols such as UMTS (Universal Mobile Telecommunications System) and EV-DO (Evolution-Data Optimized), 4G cellular telephone communications protocols such as LTE, etc.

Data signals that are to be transmitted by device 10 may be provided to baseband processor 18. Baseband processor 18 may be implemented using a single integrated circuit (e.g., a baseband processor integrated circuit) or using multiple integrated circuits. Baseband processor 18 may receive signals to be transmitted via antennas 34 over path 13 from storage and processing circuitry 16. The digital baseband processor 18 may, for example, serve as an I/Q generator that outputs I and Q samples (e.g., sometimes referred to as "in-phase data" and "quadrature data." respectively).

Digital predistortion circuitry 20 may receive the IQ samples and optionally convert the IQ samples from the I-Q coordinate plane into an equivalent representation in the polar coordinate plane. Once the IQ samples have been converted into the polar coordinate system in which the magnitude of the signals corresponds to the amplitude of the signal to be transmitted and in which the angle of the signals corresponds to the phase of the signal to be transmitted, circuitry 20 may predistort the converted signals according to a predetermined set of predistortion coefficients.

In the example of FIG. 1, the amplitude of the transmitted signals may be altered according to an amplitude modulation predistortion coefficient value (sometimes referred to as the "AMAM" value), whereas the phase of the transmitted signals may be altered according to a phase modulation predistortion coefficient value (sometimes referred to as the "AMPM" value). In at least some embodiments, predistortion circuitry 20 may receive a gain control signal $G_d$, which can be used to apply a digital scaling factor that affects only the amount of amplitude modulation applied by circuitry 20 (e.g., predistortion circuitry 20 may have an amplitude modulation circuit that is controlled by $G_d$). Digital gain control signal $G_d$ may therefore serve as one of the available tuning knobs for adjusting the gain of the transmit path.

The digital-to-analog converter (DAC) 22 may receive the digital predistorted signals from predistortion circuitry 20. Converter 22 may be configured to perform digital-to-analog conversion on the digital predistorted signals and may pass an analog version of the predistorted signals to up-conversion circuitry 24. Up-conversion circuitry 24 may serve to up-convert the predistorted signals from baseband to radio frequencies. Up-conversion circuitry 24 may then pass the up-converted and predistorted signals to driver amplifier circuit 26.

Driver amplifier 26 may include one or more amplifier stages such as stages 28. As an example, driver amplifier 26 may have three series-connected signal amplifier driver stages 28. One or more control signals from storage and processing circuitry 16 may be used to selectively enable and disable stages 28 or to control the gain of individual stages. Enabling and disabling stages 28 selectively and/or adjusting the gain of individual stages separately may place the driver amplifier into different power modes. For example, the driver amplifier may be placed into a high power mode (sometimes referred to as high gain mode) by enabling all three of driver amplifier stages 28 or may be placed into a low power mode (sometimes referred to as low gain mode) by enabling only two of the driver amplifier stages 28. Other configurations may be used if desired.

In one suitable embodiment of the present invention, the gain of driver amplifier 26 may be fine-tuned by adjusting a radio-frequency gain index (RGI). Incrementing the gain index may, for example, increase the amount of bias current that is provided to one or more of the stages to increase the gain and/or maximum power output of the driver amplifier. Radio-frequency gain index control signal RGI may therefore serve as another one of the available tuning knobs for adjusting the gain of the transmit path.

Driver amplifier 26 may provide amplified signals to the power amplifier 32 via matched filter circuit 30. Matched filter circuit 30 may include a network of passive components such as resistors, inductors, and/or capacitors that are configured to ensure that the antenna structures 34 are impedance matched to the rest of the wireless communications circuitry (e.g., to ensure maximum power transfer via antenna 34) and to filter out interference signals generated at unwanted frequencies. Circuit 30 may also include filters such as a radio-frequency duplexer and other radio-frequency output stage circuitry such as radio-frequency switches and passive elements. Switches may, if desired, be used to switch the wireless circuitry between a transmitting mode and a receiving mode. A duplexer may be used to route input and output signals based on their frequency. During data transmission, power amplifier circuitry 32 may boost the output power of transmitted signals to a sufficiently high level to ensure adequate signal transmission at antenna structures 34. The example of FIG. 1 in which driver amplifier 26 and power amplifier 32 are shown as separate components is merely illustrative. In other arrangements, driver amplifier 26 may sometimes be considered to be part of power amplifier 32.

In general, any suitable antenna structures may be used in device 10. For example, device 10 may have one antenna or may have multiple antennas. Antenna(s) 34 in device 10 may each be used to cover a single communications band or each antenna may cover multiple communications bands. If desired, one or more antennas may cover a single band while one or more additional antennas are each used to cover multiple bands.

Due to non-idealities associated with radio-frequency power amplifier 32, the signals produced at the output of power amplifier 32 are not only amplified but are also distorted by non-linear power transfer characteristics of power amplifier 32. If predistortion circuitry 32 is properly set (e.g., using properly calibrated predistortion coefficients AMAM and AMPM), signals generated at the output of power amplifier 32 will produce a frequency response that is substantially similar to that of the desired frequency response of the original signal prior to predistortion and amplification. In general, predistortion circuitry 20 can be used to correct for any undesired magnitude and phase deviations associated with power amplifier 32, thereby improving power amplifier efficiency and wireless performance.

Figure 2:
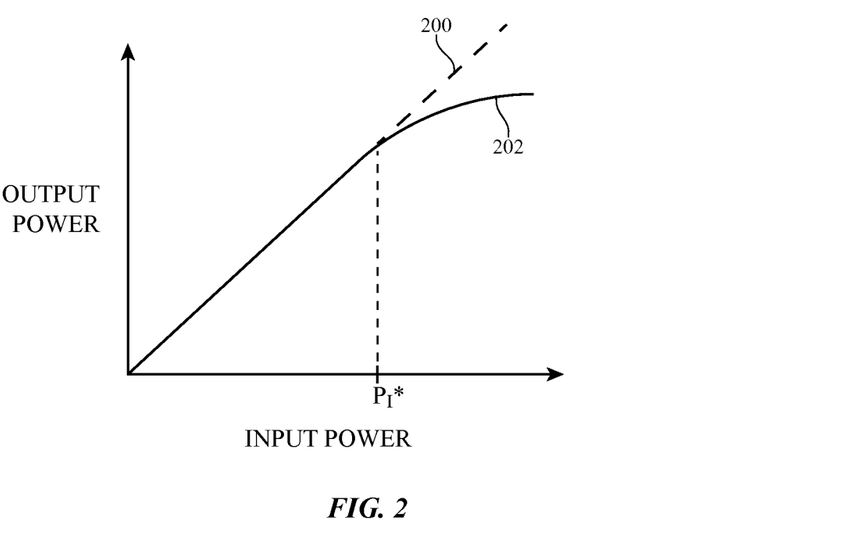
FIG. 2 is an exemplary diagram plotting output power level versus input power level of a radio-frequency power amplifier in accordance with an embodiment.

Ideally, radio-frequency power amplifier 32 exhibits a perfectly linear power response. FIG. 2 plots output power level versus input power level for an illustrative radio-frequency power amplifier. Response line 200 may represent an ideal power characteristic, whereas line 202 may represent an actual power characteristic of the power amplifier in practice. As shown in FIG. 2, line 200 may have a constant slope across all input power levels (i.e., any increase in input power results in a corresponding increase in output power by a predetermined amount).

It is, however, challenging to manufacture power amplifiers that exhibit perfectly linear power transfer characteristics. In practice, increases in input power levels may not always increase the output power by the predetermined amount. As shown by line 202 in FIG. 2, the slope of line 202 may deviate from the desired slope of line 200 after a certain power level $P_I^*$. This undesired deviation may result in a reduction in the gain provided by the power amplifier at input power levels greater than $P_I^*$ and may therefore sometimes be referred to as gain compression. In general, radio-frequency power amplifier 32 in device 10 may exhibit gain compression and/or may deviate from the ideal transfer characteristic in any other way.

Figure 3:
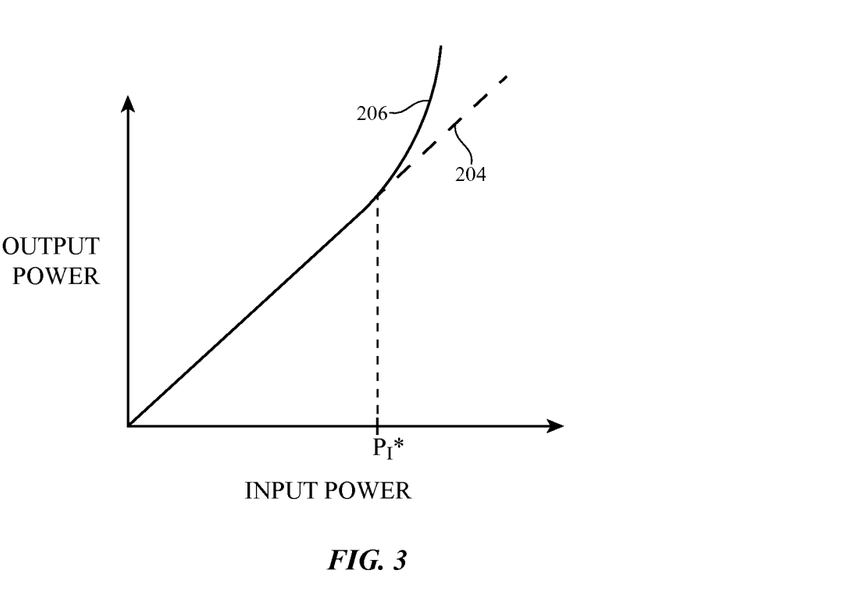
FIG. 3 is an exemplary diagram plotting output power level versus input power level of digital predistortion circuitry in accordance with an embodiment.

As described above in connection with FIG. 1, predistortion circuitry 20 may be used to introduce signal distortion that compensates for undesired deviation(s) from the ideal power transfer characteristic (e.g., to counteract any undesirable non-linear behavior associated with power amplifier 32). FIG. 3 plots output power level versus input power level for an exemplary predistortion circuit. Line 204 may exhibit a constant slope of one, whereas line 206 may exhibit the actual power characteristic of the predistortion circuit. For all signals that are received by the predistortion circuitry and that have power levels less than or equal to $P_I^*$, these signals may be passed through to the output of the predistortion circuit without any amplification nor attenuation. For all signals that are received with the predistortion circuit and that have power levels greater than $P_I^*$, these signals may be provided with an appropriate amount of gain to compensate for the gain compression associated with the power amplifier as described in connection with FIG. 2.

Line 206 of FIG. 3 is merely illustrative. In general, predistortion circuitry 20 may exhibit a power transfer curve having an inverse relationship with respect to the input-output transfer characteristic associated with power amplifier 32 (e.g., a positive deviation in line 202 from line 200 at a given first input power level may be accompanied by a negative deviation in line 206 from line 204 at the given first input power level, whereas a negative deviation in line 202 from line 220 at a given second input power level may be accompanied by a positive deviation in line 206 from line 204 at the given second input power level).

Figure 4:
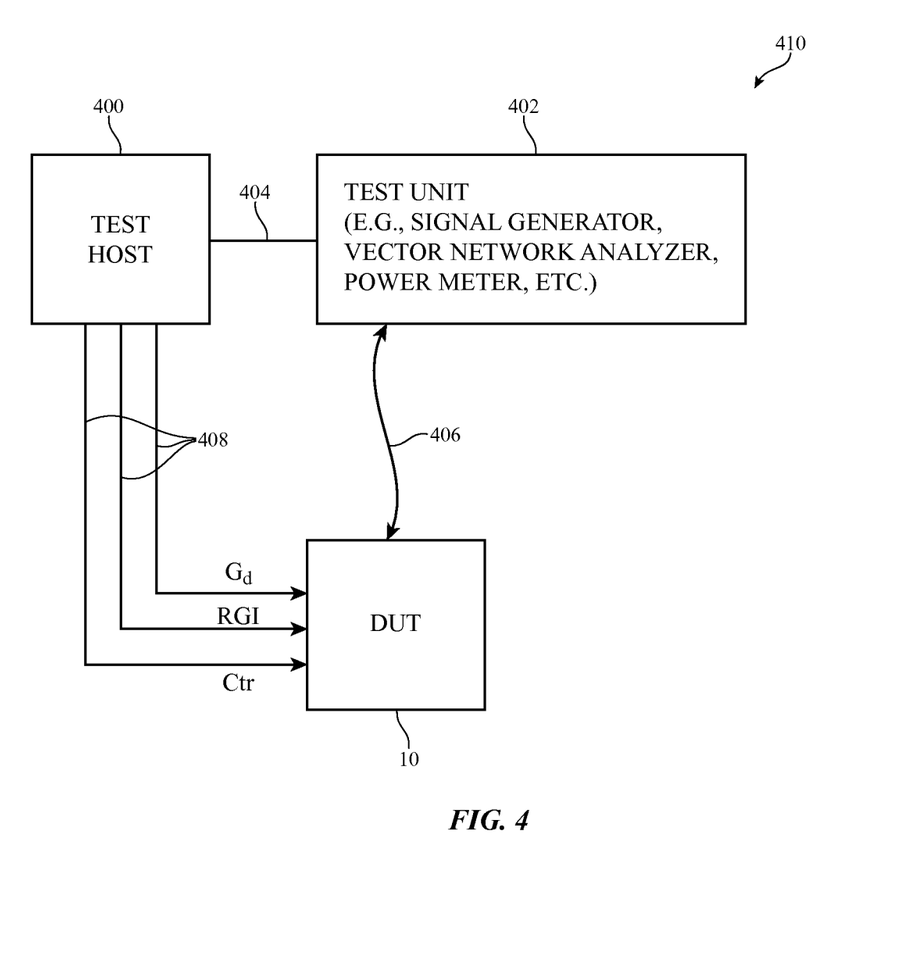
FIG. 4 is a diagram of an illustrative test system that can be used to perform predistortion calibration in accordance with an embodiment.

FIG. 4 shows an illustrative test system for testing an electronic device 10. An electronic device 10 that is being characterized using the radio-frequency test system of FIG. 4 may sometimes be referred to as a "device under test" (DUT). As shown in FIG. 4, the test system may include a test host such as test host 400 (e.g., a personal computer), a radio-frequency tester such as radio-frequency tester 402, control circuitry, network circuitry, cabling, and other test equipment. All equipment other than the DUT may be considered to be test equipment 410.

Radio-frequency tester 402 may be any suitable test unit that can be used to generate radio-frequency test signals and/or to receive and perform radio-frequency measurements on the received signals. As examples, test unit 402 may be a radio-frequency signal generator, a vector network analyzer (VNA), a radio-frequency power meter, just to name a few. Radio-frequency tester 402 may receive commands from test host 400 via path 404 that direct tester 402 to transmit radio-frequency test signals to the DUT via a wired or wireless path 406 or to gather radio-frequency measurement from the DUT. If desired, test data can be provided from tester 402 to test host 400 via path 404.

During testing, DUT 10 may receive one or more control signals from test host 400 via paths 408. The control signals conveyed over paths 408 may serve to place DUT 100 in the desired state for characterization. For example, test host 400 may place DUT 10 in a first state by configuring DUT 10 using a given digital gain value $G_d$ and radio gain index RGI during a first test iteration. Test unit 402 may then be used to gather a first set of radio-frequency measurements on the DUT. Thereafter, test host 400 may place DUT 10 in a second state by configuring DUT 10 using a new digital gain value $G_d$ and a new radio gain index RGI during a subsequent test iteration. Test unit 402 may then be used to gather a second set of radio-frequency measurement on the DUT. In general, any suitable control signal/setting Ctr may be used to configured DUT 10 in the desired state during testing.

The test system of FIG. 4 is merely illustrative and does not serve to limit the scope of the present invention. If desired, the wireless test system may include other means of controlling and monitoring the operation of DUT 10, may include other types of radio-frequency testers for measuring the performance of DUT 10, and may include any other suitable test equipment.

The test system of FIG. 4 may be used to perform predistortion calibration on a wireless device under test. In general, the amount of predistortion can differ depending on the frequency of operation and as a result, it may be desirable to be able to obtain predistortion coefficient values at each individual radio-frequency channel within a given radio-frequency band of interest. A radio-frequency band such as band-2 of the 1900 MHz Personal Communications Service (PCS) band associated with the UMTS communications protocol may include hundreds of channels. Conventional predistortion calibration operations would require performing radio-frequency power measurements at each of these channels in order to separately compute the corresponding predistortion values. Performing predistortion calibration repetitively in this way can, however, be extremely time consuming. It may therefore be desirable to provide a more efficient way of obtaining predistortion coefficients across different channels in any given radio-frequency band.

Figure 5:
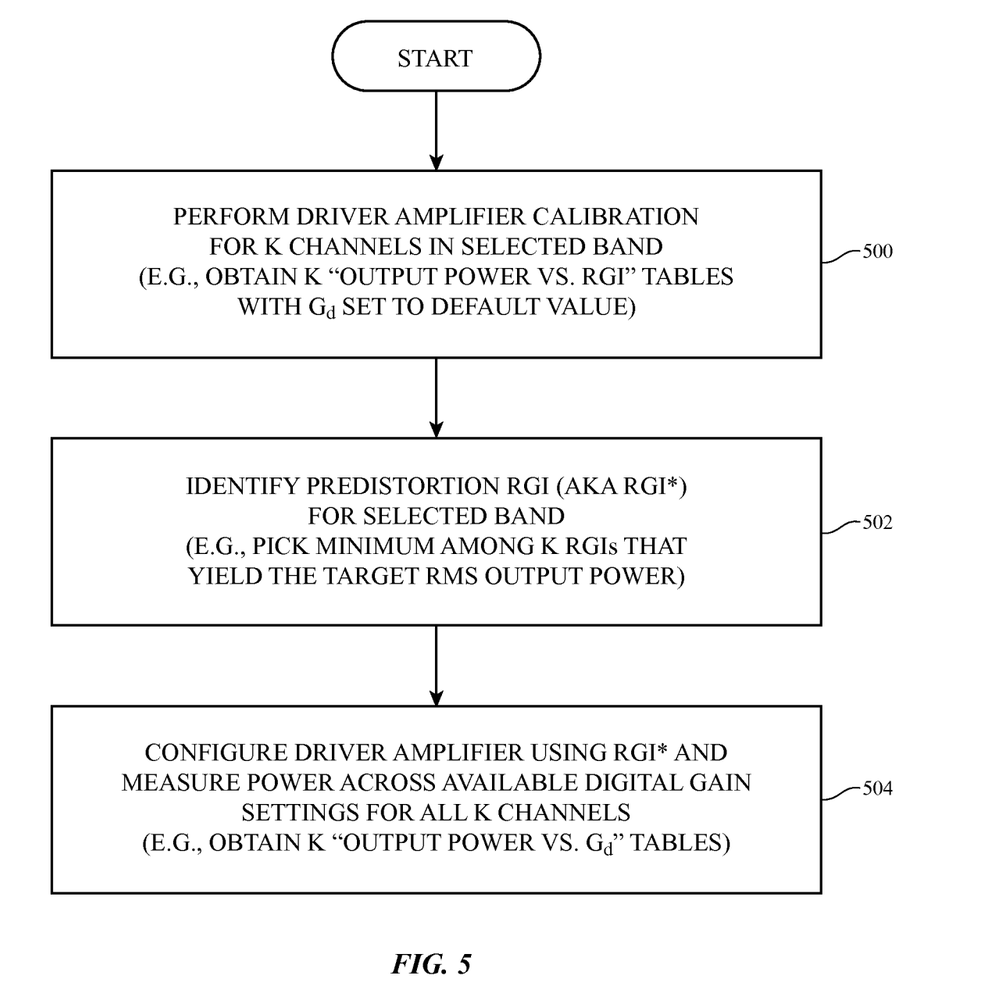
FIG. 5 is a flow chart of illustrative steps for obtaining baseline radio-frequency power measurements for each channel in a given band in accordance with an embodiment.

FIG. 5 is a flow chart of illustrative steps for obtaining baseline radio-frequency measurements for each channel in a selected radio-frequency band under test. Assume that the selected radio-frequency band currently being tested includes k channels. At step 500, the test system of FIG. 4 may be used to perform driver amplifier calibration for each of the k channels in the selected band. Driver amplifier calibration may involve setting the digital gain control setting $G_d$ to a default value while measuring the root mean square output power level $P_{out,rms}$ at the output of the power amplifier using a power meter 402 at different RGI settings.

Figure 6:
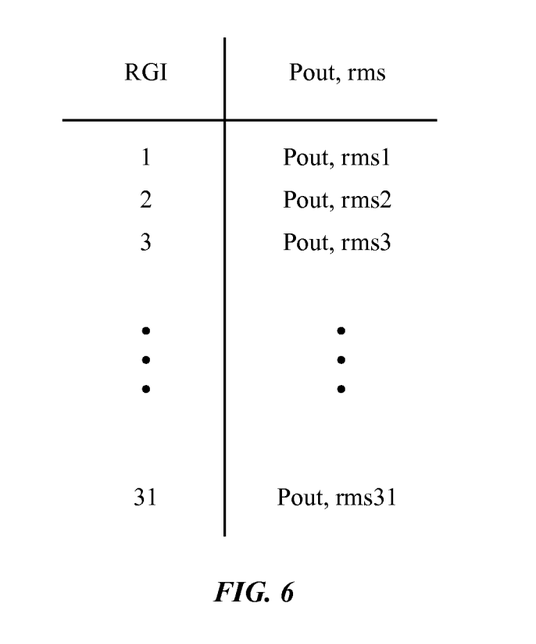
FIG. 6 shows an illustrative table of output power values ($P_{out,rms}$) as a function of radio gain index (RGI) in accordance with an embodiment.

Measurements obtained during step 500 are shown in the table of FIG. 6. For example, a first $P_{out,rms1}$ value may be measured when RGI has a first (1) setting; a second $P_{out,rms2}$ value may be measured when RGI has a second (2) setting; a third $P_{out,rms3}$ value may be measured when RGI has a third (3) setting; etc. In the example of FIG. 6, driver amplifier 26 may receive up to 31 different RGI settings. This is merely illustrative. Driver amplifier 26 may have more or less than 31 possible RGI settings. The table of FIG. 6 may be referred to as an "output power versus RGI" table. This table may be obtained for each of the k channels and stored in test host 400.

At step 502, test host 400 may be used to identify a particular predistortion RGI value (sometimes referred to herein as RGI*) for the selected band. There may be a desired target output value $P_{target,rms}$ for the selected band that is set by some wireless communications standard. The predistortion RGI may be selected by identifying a particular RGI that yields an output power $P_{out,rms}$ that is substantially equal to $P_{target,rms}$ for each of the k channels (i.e., by analyzing each of the k output power vs. RGI tables obtained during step 500), and then selecting a minimum RGI from the k identified RGI values. In other words, RGI* may be equal to the minimum RGI setting among the k individual RGIs that yield $P_{target,rms}$.

Figure 7:
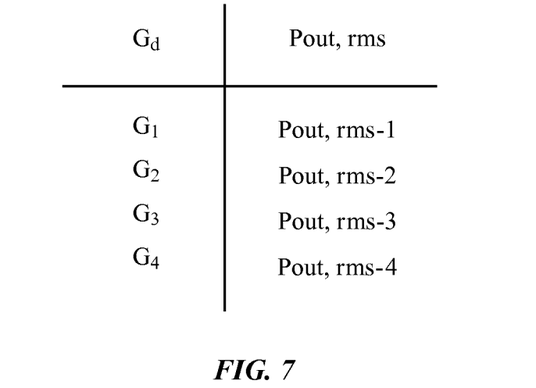
FIG. 7 shows an illustrative table of output power values ($P_{out,rms}$) as a function of digital gain ($G_d$) for a given predistortion RGI in accordance with an embodiment.

At step 504, test host 400 may supply RGI* to DUT 10 so that driver amplifier 26 is configure using the predistortion RGI setting obtained during step 502. Test unit 402 may then be used to gather power measurements across all available digital gain settings $G_d$ for each of the k channels. Measurements obtained during step 504 are shown in the table of FIG. 7. For example, a first $P_{out,rms\text{-}1}$ value may be measured when $G_d$ has a first setting $G_1$; a second $P_{out,rms\text{-}2}$ value may be measured when $G_d$ has a second setting $G_2$; a third $P_{out,rms\text{-}3}$ value may be measured when $G_d$ has a third setting $G_3$; etc. In the example of FIG. 7, only four different digital gain settings $G_{1\text{-}4}$ are being tested. This is merely illustrative. Predistortion circuitry 20 may have more or less than four possible digital gain settings. The table of FIG. 7 may sometimes be referred to as an "output power versus $G_d$" table. This table may be obtained for each of the k channels and stored in test host 400.

Figure 8:
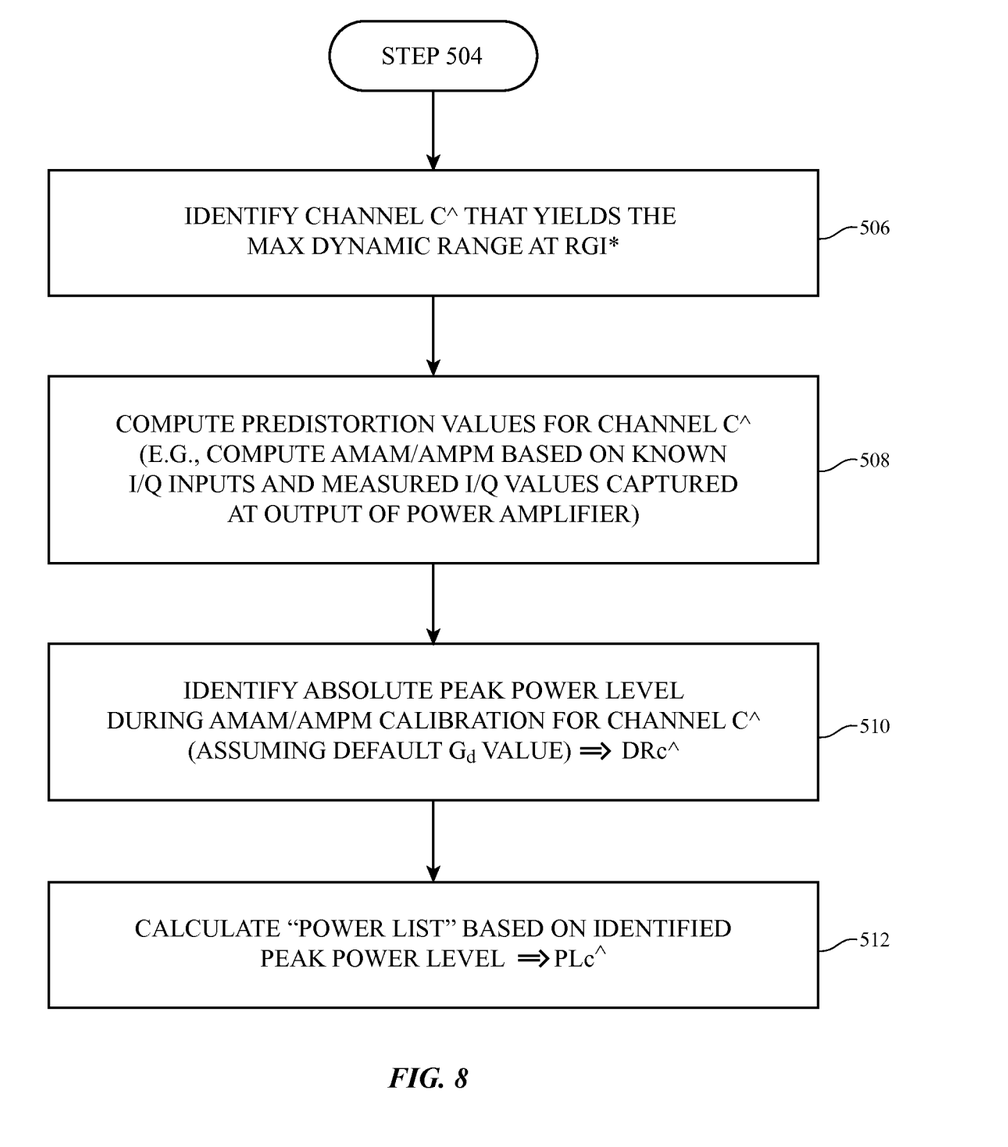
FIG. 8 is a flow chart of illustrative steps for selecting a given channel for calibration and steps for obtaining predistortion coefficients for the given channel in accordance with an embodiment.

FIG. 8 is a flow chart of illustrative steps for selecting a given channel for predistortion calibration and steps for obtaining predistortion coefficients for that given channel. At step 506, test host 400 may be used to identify a channel ĉ that yields the maximum output power with the radio gain index set to RGI*. For example, each of the k channels will yield corresponding $P_{out,rms}$ values when RGI is set to RGI*. The channel that yields the maximum $P_{out,rms}$ may be selected as channel ĉ. A channel ĉ selected in this way should therefore represent the in-band channel with the highest dynamic range.

At step 508, test host 400 may configured DUT 10 to generate and transmit known input test signals in only the selected channel ĉ while test unit 402 is used to gather corresponding output test signals at the output of the radio-frequency power amplifier. Test host 400 may then correlate the output test signals to the input test signals and compute an inverse of the correlation to obtain predistortion coefficient values for channel ĉ. For example, test host 400 may be configured to compute AMAM and AMPM values based on the known IQ samples generated by baseband processor 18 and the measured IQ samples captured at the output of the power amplifier 32 (see. FIG. 1). During this step, DUT 10 may be configured using a default digital gain setting $G_d$ (as an example).

At step 510, test host 400 may identify an absolute peak power level that is measured during the AMAM/AMPM calibration for channel ĉ during step 508. An absolute peak power level identified in this way is sometimes referred to as the dynamic range for selected channel ĉ and is indicated herein as DRĉ.

Figure 9:
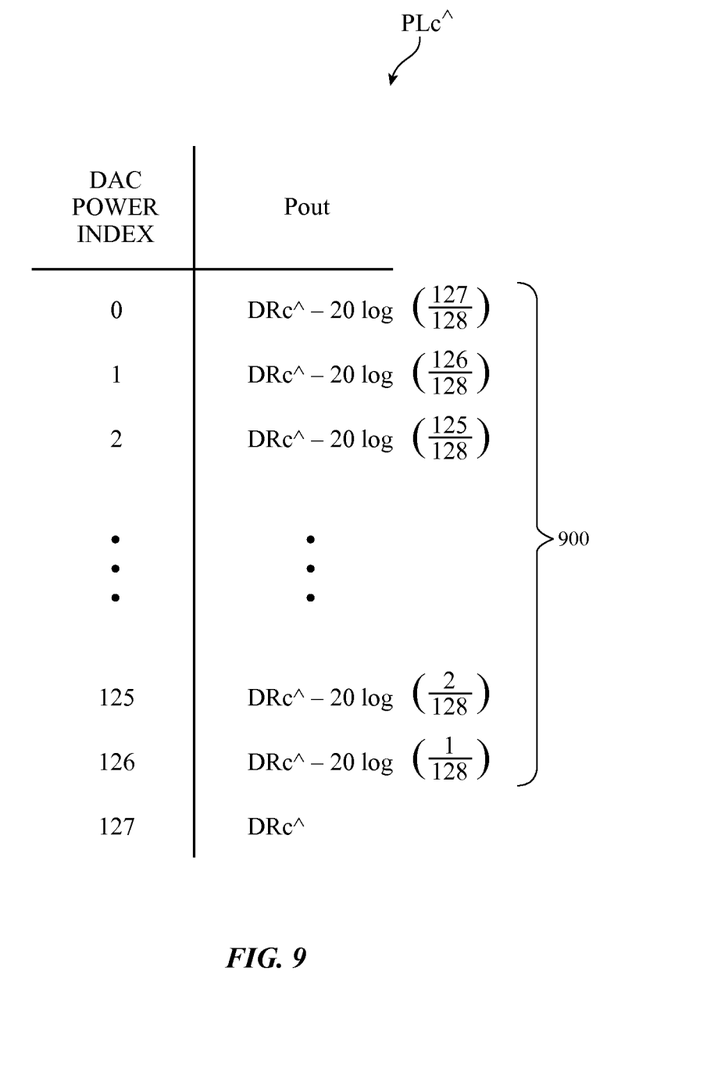
FIG. 9 shows an illustrative computed power list that is associated with the given channel in accordance with an embodiment.

At step 512, test host 400 may compute a power list for channel c^ based on the identified peak power level, which is indicated herein as PLc^. A "power list" may be defined herein as a list of discrete output power levels that is mapped to a corresponding set of DAC power indices. FIG. 9 is a table showing exemplary values in power list PLc^. As shown in FIG. 9, the power list may be plotted as a function of the DAC power index, which ranges from 0-127 in this particular example. The number of available DAC power indices may depend on the particular resolution of DAC 22, which can vary among different wireless chipset architectures. The highest DAC power index should be mapped to the dynamic range value DRc^ previously obtained during step 510. The remaining power values for the other indices may be computed using expressions 900 in FIG. 9.

As an example, the $126^{th}$ DAC index may correspond to a computed output power that is equal to [DRc^−20*log(1/128)]. As another example, the $125^{th}$ DAC index may correspond to a computed output power that is equal to [DRc^−20*log(2/128)]. As yet another example, the zeroth DAC index may correspond to a computed output power that is equal to [DRc^−20*log(127/128)]. The expressions 900 described here are merely illustrative and do not limit the scope of the present invention. Similar methods may be applied to obtain power lists for DACs with any suitable resolution.

Thus far, predistortion coefficient values AMAM/AMPM and a power list have been obtained for a particular channel c^. Predistortion coefficients for each power level in PLc^ should have already been computed during step 508. In conventional predistortion calibration operations, step 508 may be repeated for each of the k in-band channels (i.e., at least step 508 is repeated k times to calibrate the entire band). Performing predistortion calibration iteratively in this way may be extremely time consuming and can be costly to implement.

In accordance with an embodiment, the actual computation of AMAM/AMPM from measured IQ samples may be performed only once in channel c^, and the predistortion coefficients for the other (k−1) channels can be calculated using simple mathematics based on the power relationship between each of the (k−1) remaining channels and channel c^.

Figure 10:
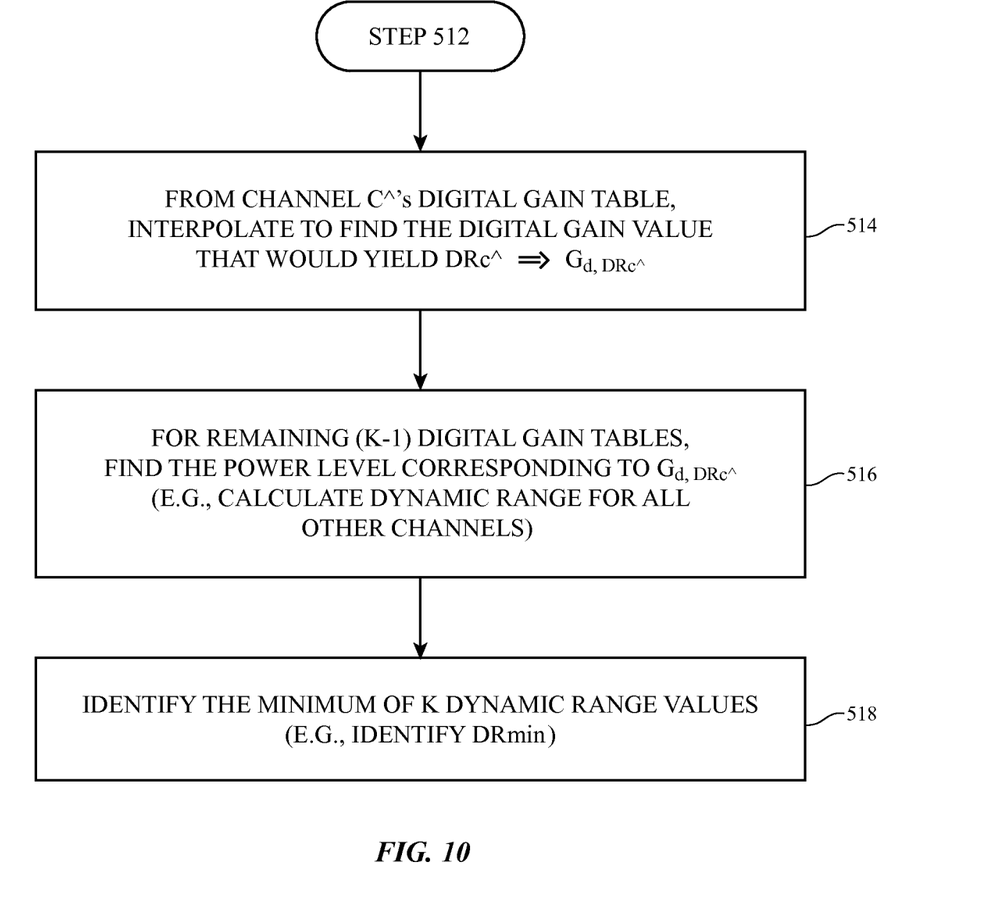
FIG. 10 is a flow chart of illustrative steps for obtaining a minimum dynamic range value across all in-band channels of interest in accordance with an embodiment.

FIG. 10 is a flow chart of illustrative steps for obtaining a minimum dynamic range value across all the in-band channels. At step 514, test host 400 may refer to channel c^'s digital gain table (e.g., one of the tables obtained during step 504 in FIG. 5 and see also FIG. 7) and may interpolate from the values in that table to find the digital gain setting that would yield power level DRc^. For example, consider a scenario in which channel c^ has a measured $P_{out,rms}$ of 25 dBm corresponding to a $G_d$ of 40 and a measured $P_{out,rms}$ of 33 dBm corresponding to a $G_d$ of 60. Assuming DRc^ is equal to 31 dBm, a corresponding $G_d$ of 55 may be interpolated based on the neighboring values (i.e., 40+[(60−40)/(33−25)*(31−25)]=55). The particular digital gain setting computed in this way may be referred to herein as $G_{d,DRc^}$.

At step 516, test host 400 may refer to each of the remaining (k−1) channels' digital gain table and identify the output power level corresponding to $G_{d,DRc^}$ (e.g., to calculate the dynamic range of the (k−1) remaining channels). Consider a first example in which a channel c17 has a measured $P_{out,rms}$ of 28 dBm corresponding to a $G_d$ of 40 and a measured $P_{out,rms}$ of 36 dBm corresponding to a $G_d$ of 60. The dynamic range of channel c17 may therefore be computed as being equal to 34 dBm (i.e., 28+[(36−28)/(60−40)*(55−40)]=34). Consider a second example in which a channel c119 has a measured $P_{out,rms}$ of 24 dBm corresponding to a $G_d$ of 40 and a measured $P_{out,rms}$ of 31 dBm corresponding to a $G_d$ of 60. The dynamic range of channel c119 may therefore be computed as being equal to 29.25 dBm (i.e., 24+[(31−24)/(60−40)*(55−40)]=29.25). The dynamic range of each in-band channel may be computed in this way.

At step 518, test host 400 may identify the minimum of the k total dynamic range values DRc1, DRc2, .... DRc^, ..., and DRck. The minimum dynamic range value obtained in this way may be indicated herein as DRmin, where DRmin is equal to minimum(DRc[1:k]). DRmin determined in this way may serve as the reference dynamic range value to be used for these k channels during normal operation of device 10.

Figure 11:
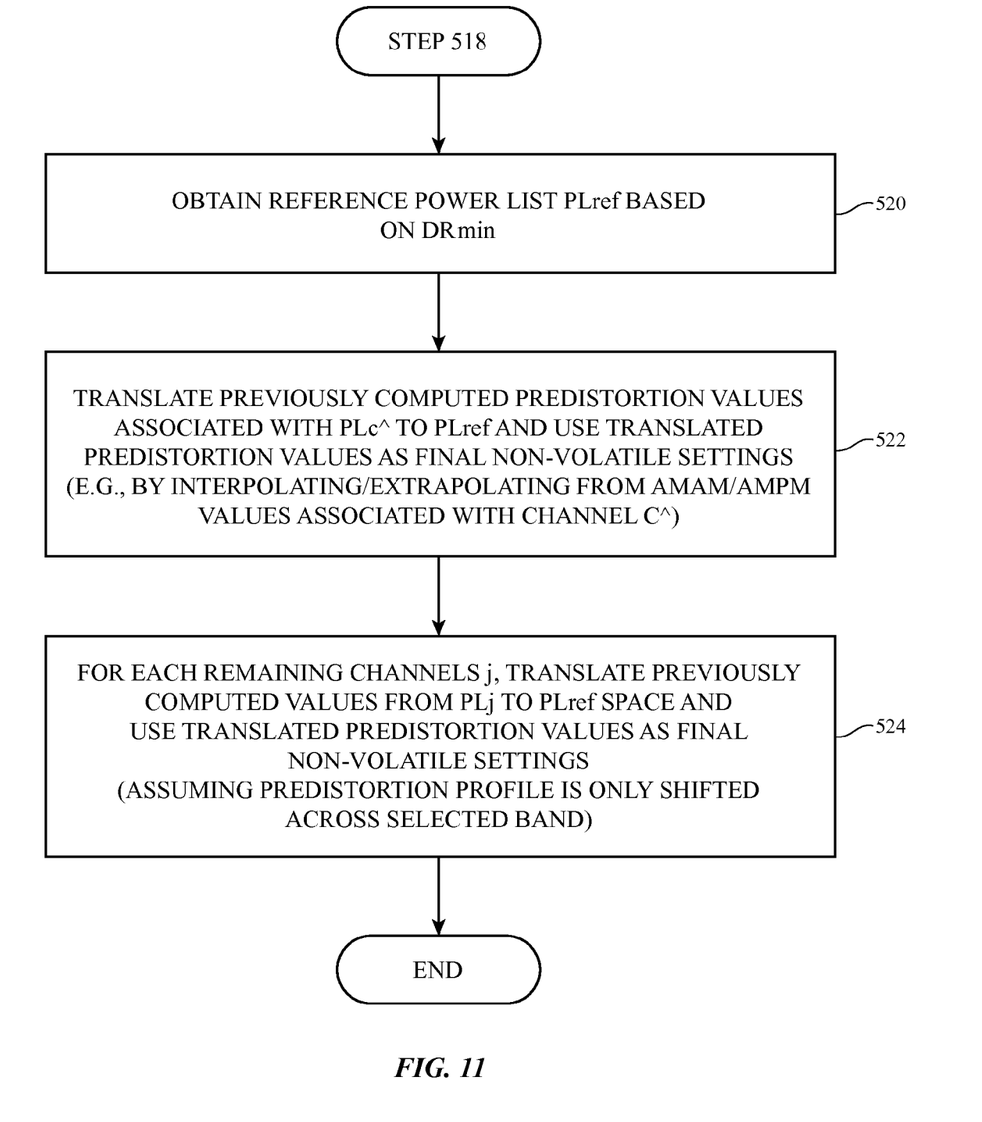
FIG. 11 is a flow chart of illustrative steps for computing predistortion coefficients for all the in-band channels by interpolating/extrapolating from the measured values associated with the given channel in accordance with an embodiment.

FIG. 11 is a flow chart of illustrative steps for computing predistortion coefficients for all the in-band channels by interpolating/extrapolating from the AMAM/AMPM values associated with channel c^. At step 520, test host 400 may compute a reference power list PLref based on DRmin obtained during step 518. The different power levels in PLref may be computed using similar steps as described in connection with FIG. 9. For example, assuming that the DAC indices range from 0-63, DAC index 63 may correspond to DRmin, DAC index 62 may correspond to a calculated value of [DRmin−20 log (1/64)], DAC index 61 may correspond to a calculated value of [DRmin−20 log(2/64)], and so on.

Figure 12:
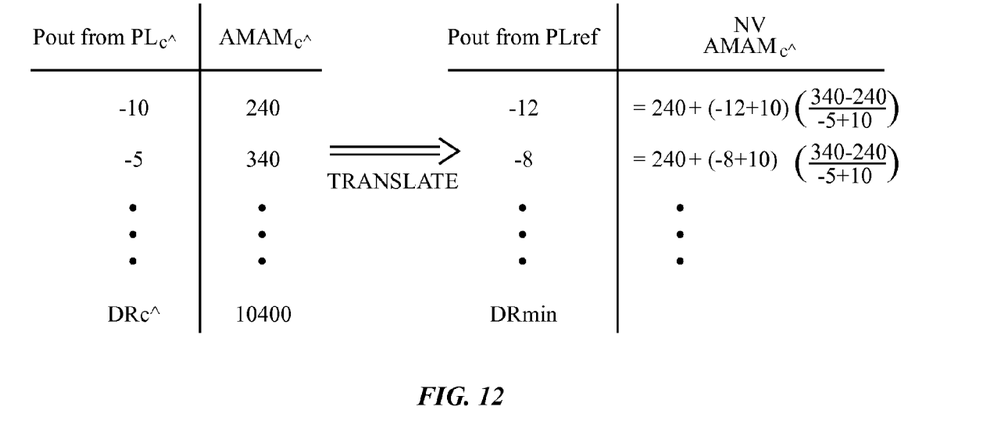
FIG. 12 is a diagram showing how predistortion coefficients may be translated from the power list of the given channel to a reference power list associated with the identified minimum dynamic range in accordance with an embodiment.

At step 522, test host 400 may translate the predistortion values previously computed during step 508 in FIG. 8 (i.e., AMAM/AMPM values associated with channel c^) from the PLc^ axis to the PLref axis by interpolating/extrapolating from the predetermined AMAM/AMPM values. FIG. 12 is a diagram showing how predistortion coefficients may be translated from PLc^ to PLref. Predistortion values for channel c^ (AMAMc^) corresponding to each power level in power list PLc^ should have been obtained during steps 508 and 512. The different power levels in power list PLref should have been obtained during step 520. At this point, translated predistortion values may be interpolated/extrapolated based on neighboring samples.

In the example of FIG. 12, channel c^ has a pre-translated AMAM value of 240 corresponding to a first output power level of −10 dBm in PLc^ and a pre-translated AMAM value of 340 corresponding to a second output power level of −5 dBm in PLc^. Assuming PLref has corresponding first output power level of −12 dBm and a second output power level of −8 dBm, the translated AMAM value for channel c^ may have an extrapolated value that is equal to 200 (i.e., 240+(−12+10)[(340−240)/(−5+10)]=200) corresponding to the first power level of −12 dBm and an interpolated value that is equal to 280 (i.e., 240+(−8+10)[(340−240)/(−5+10)]=280) corresponding to the second power level of −8 dBm. Translated AMAM values for the remaining power levels in PLref may be computed in this way for channel c^. Translated AMAM predistortion coefficients obtained as such may serve as actual configuration data for device 10 during user operation and may therefore be written in non-volatile memory (NVM) on device 10. The translated AMAM values may therefore sometimes be referred to as non-volatile (NV) AMAM calibration values. The example of FIG. 12 in which only AMAM values are shown is merely illustrative. If desired, AMPM and/or other calibration data may be computed in a similar fashion.

Referring back to FIG. 11, test host 400 may then be configured to compute translated predistortion values for each remaining channel j by converting again from the power list of channel j (PLj) to the reference power list PLref. This ensures that predistortion values for each in-band channel are adapted or "normalized" to a common reference power list. Each PLj may obtain a corresponding dynamic range value previously obtained during step 516 of FIG. 10 and may compute the other power levels using similar steps as described in connection with FIG. 9.

Figure 13:
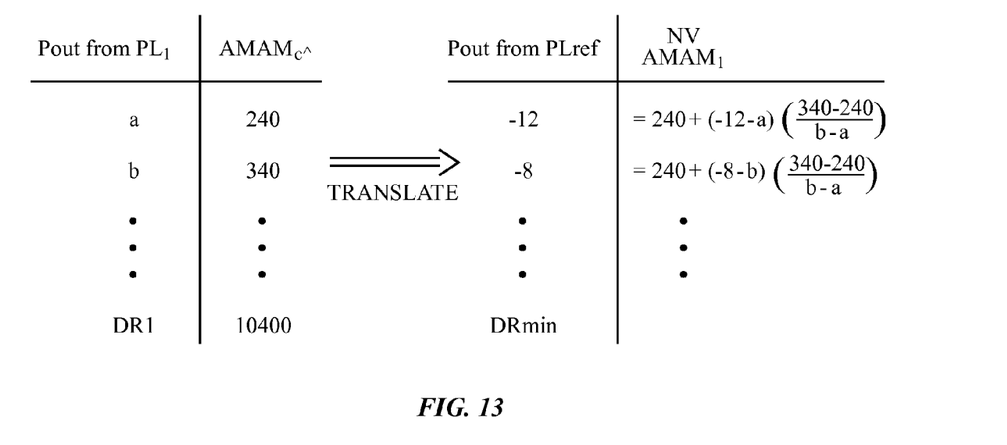
FIG. 13 is a diagram showing how predistortion coefficients may be translated from the power list of another channel that is different than the given channel to the reference power list in accordance with an embodiment.

FIG. 13 is a diagram showing how predistortion coefficients may be translated from PL1 to PLref. Assuming the predistortion profile remains the same across the given band and is simply mean-shifted for each channel, the predetermined AMAM values for channel cˆ (AMAMcˆ) may be mapped to the power values in PL1. At this point, translated predistortion values for channel c can be interpolated/extrapolated based on neighboring samples.

In the example of FIG. 13, channel c1 has a pre-translated AMAM value of 240 corresponding to a first output power level of 'a' dBm in PL1 and a pre-translated AMAM value of 340 corresponding to a second output power level of 'b' dBm PL1. Assuming PLref has corresponding first output power level of −12 dBm and a second output power level of −8 dBm (which is consistent with the example of FIG. 12), the translated/normalized AMAM value for channel c1 may have an extrapolated value that is equal to $\{240+(-12-a)[(340-240)/(b-a)]\}$ corresponding to the first power level of −12 dBm and an interpolated value that is equal to $\{240+(-8-b)[(340-240)/(b-a)]\}$ corresponding to the second power level of −8 dBm.

Translated AMAM values for the remaining power levels in PLref may be computed in this way for channel c1. If desired, AMPM and/or other calibration data may be computed in a similar fashion. Non-volatile predistortion coefficient values may be obtained in this way for all remaining (k−2) channels in the given band. Alternatively, each channel can simply use the predetermined predistortion values associated with channel cˆ without having to translate to the reference power list PLref to save a processing step.

The foregoing is merely illustrative of the principles of this invention and various modifications can be made by those skilled in the art without departing from the scope and spirit of the invention. The foregoing embodiments may be implemented individually or in any combination.

What is claimed is:

1. A method comprising:
   testing wireless communications circuitry on an electronic device, wherein the wireless communications circuitry comprises digital predistortion circuitry and testing the wireless communications circuitry comprises:
   obtaining predistortion values for a selected channel in a radio-frequency band by computing an inverse on input-output signals measured from the selected channel;
   obtaining predistortion values for other channels in the radio-frequency band without computing another inverse;
   identifying a dynamic range for each channel in the radio-frequency band; and
   computing a list of discrete output power levels for each channel in the radio-frequency band based on the identified dynamic range for that channel; and
   with the digital predistortion circuitry, predistorting data signals using the predistortion values.

2. The method defined in claim 1, wherein obtaining the predistortion values comprises obtaining predistortion coefficient values for a power amplifier in the wireless communications circuitry.

3. The method defined in claim 2, wherein obtaining the predistortion values from the selected channel comprises receiving input test signals with the power amplifier and generating output test signals with the power amplifier, and wherein computing the inverse on the input-output signals comprises computing the inverse on the output test signals that is a function of the input test signals.

4. The method defined in claim 1, further comprising:
   computing a list of reference output power levels based on a minimum dynamic range in the radio-frequency band.

5. The method defined in claim 4, further comprising:
   computing new predistortion values for the selected channel based on the list of discrete output power levels for the selected channel, the list of reference output power levels, and the obtained predistortion values for the selected channel.

6. The method defined in claim 4, wherein obtaining the predistortion values for the other channels in the radio-frequency band comprises interpolating and extrapolating values based on the list of discrete output power levels for the other channels, the list of reference output power levels, and the obtained predistortion values for the selected channel.

7. The method defined in claim 5, further comprising:
   loading the new predistortion values into non-volatile memory on the electronic device.

8. A method for characterizing wireless communications circuitry on an electronic device, comprising:
   directing the wireless communications circuitry to generate input radio-frequency test signals in a selected channel in a radio-frequency band;
   using the wireless communications circuitry to generate corresponding output radio-frequency test signals in the selected channel;
   obtaining predistortion values for each channel in the radio-frequency band by computing an inverse on the relationship between the output radio-frequency test signals and the input radio-frequency test signals in only the selected channel without performing any additional inverse for other channels in the radio-frequency band;
   identifying a peak power level for the selected channel;
   obtaining a power list for the selected channel, wherein the power list includes a list of output power levels calculated based on the identified peak power level of the selected channel; and
   computing a digital gain setting that yields the identified peak power level in the selected channel by interpolating from the output power levels measured while varying the digital gain setting for the selected channel.

9. The method defined in claim 8, wherein the wireless communications circuitry includes an amplifier circuit that is controlled by a radio gain index (RGI) setting, the method further comprising:
   measuring output power levels of the wireless communications circuitry while varying the radio gain index setting for each channel in the radio-frequency band;
   identifying a radio gain index setting that yields a target output power level for each channel in the radio-frequency band; and
   identifying a minimum radio gain index setting among the identified radio gain index settings that yield the target output power level.

10. The method defined in claim 9, wherein the wireless communications circuitry further includes an amplitude modulation circuit that is controlled by the digital gain setting, the method further comprising:
    measuring output power levels of the wireless communications circuitry while the radio gain index setting is set equal to the identified minimum radio gain index setting and while varying the digital gain setting for each channel in the radio-frequency band.

11. The method defined in claim 9, further comprising:
identifying a channel in the radio-frequency band that yields the highest dynamic range as the selected channel.

12. The method defined in claim 8, further comprising:
for the other channels in the radio-frequency band, computing respective output power levels for the wireless communications circuitry when the digital gain setting is set equal to the computed digital gain setting; and
identifying a minimum output power level from the computed output power levels as a reference dynamic range.

13. The method defined in claim 12, further comprising:
obtaining a reference power list for the radio-frequency band, wherein the reference power list includes a list of output power levels calculated based on the reference dynamic range.

14. The method defined in claim 13, wherein obtaining predistortion values for each channel in the radio-frequency band comprises computing translated predistortion values by converting values that are a function of the power list associated with the selected channel to values that are a function of the reference power list.

15. A method comprising:
testing wireless communications circuitry on an electronic device, wherein the wireless communications circuitry comprises digital predistortion circuitry and testing the wireless communications circuitry comprises:
obtaining predistortion values for a selected channel in a radio-frequency band by computing an inverse on input-output signals measured from the selected channel;
computing predistortion values for other channels in the radio-frequency band by interpolating and extrapolating from the predistortion values obtained from the selected channel;
identifying a dynamic range for each channel in the radio-frequency band;
computing a power list for each channel in the radio-frequency band, wherein the power list includes output power levels calculated based on the identified dynamic range for each channel in the radio-frequency band;
identifying a given channel in the radio-frequency band having a minimum dynamic range; and
computing a reference power list based on the minimum dynamic range of the given channel; and
with the digital predistortion circuitry, predistorting data signals using the predistortion values.

16. The method defined in claim 15, wherein obtaining the predistortion values for the selected channel comprises translating predistortion values that are plotted against the power list for the selected channel to normalized predistortion values that are plotted against the reference power list.

17. The method defined in claim 15, wherein obtaining the predistortion values for the other channel comprises translating predistortion values that are plotted against the power lists for the other channels to normalized predistortion values that are plotted against the reference power list.

18. The method defined in claim 1, further comprising:
after predistorting the data signals, transmitting the data signals using an antenna in the electronic device.

19. The method defined in claim 15, further comprising:
after predistorting the data signals, transmitting the data signals using an antenna in the electronic device.

* * * * *